US008987745B2

(12) United States Patent
Du et al.

(10) Patent No.: US 8,987,745 B2
(45) Date of Patent: Mar. 24, 2015

(54) ANTI-COLORCAST DISPLAY PANEL

(71) Applicant: Shenzhen China Star Optoelectronics Technology Co., Ltd., Shenzhen, Guangdong (CN)

(72) Inventors: Peng Du, Guangdong (CN); Jiali Jiang, Guangdong (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 8 days.

(21) Appl. No.: 14/000,222

(22) PCT Filed: Jun. 28, 2013

(86) PCT No.: PCT/CN2013/078351
§ 371 (c)(1),
(2) Date: Aug. 19, 2013

(87) PCT Pub. No.: WO2014/190584
PCT Pub. Date: Dec. 4, 2014

(65) Prior Publication Data
US 2014/0353668 A1 Dec. 4, 2014

(30) Foreign Application Priority Data

May 28, 2013 (CN) .......................... 2013 1 0203906

(51) Int. Cl.
*H01L 21/00* (2006.01)
*H01L 27/12* (2006.01)

(52) U.S. Cl.
CPC .................................... *H01L 27/124* (2013.01)
USPC ............................................................ 257/72

(58) Field of Classification Search
CPC ...................................................... H01L 27/124
USPC .............................. 257/72; 345/690; 348/60
See application file for complete search history.

(56) References Cited

U.S. PATENT DOCUMENTS

2012/0320173 A1* 12/2012 Kim et al. ....................... 348/60
2014/0078186 A1* 3/2014 Chen et al. .................... 345/690

* cited by examiner

*Primary Examiner* — Laura Menz

(57) ABSTRACT

An anti-colorcast display panel is provided, comprising horizontal scanning lines and vertical data lines. It further includes sub-pixels disposed between adjacent scanning lines and adjacent data lines and arranged in a form of array. Every m×n sub-pixels form a pixel unit. Each sub-pixel includes a transistor whose gate is connected to the scanning line, source is connected to the data line, and drain is connected to two capacitors. The connections of the transistors in corresponding sub-pixels in each pixel unit are same. The data line will connect two adjacent sub-pixels in one row respectively when connecting the sources in the pixel unit, while the gates of the two adjacent sub-pixels are connected to the upper and lower scanning line. The extent of colorcast can be suppressed when implementing color mixing with the present invention, thus improving the color-displaying effect of the display panel, especially for the narrow-frame monitor.

5 Claims, 2 Drawing Sheets

ANTI-COLORCAST DISPLAY PANEL

TECHNICAL FIELD

The present invention relates to the field of displaying technology, and more particularly, relates to an anti-colorcast display panel.

BACKGROUND

In a liquid crystal display panel, it usually comprises a plurality of liquid crystal unit cells, and the displaying effect of the liquid crystal unit cells are controlled by transistors. Generally, the transistors are turned on continuously by scanning signals according to the rank order. In a traditional tri-gate liquid crystal panel; however, in order to reduce the cost, a design with high pin counts, for example comprising a set of fanouts and an IC, is always adopted at the source of the transistor. The difference among the resistances of such fanouts (Rmax–Rmin) is usually relatively large. In practice, if the difference of the impedances is too large, the colorcast will be generated on both sides of the display panel easily when the image with mixing colors is displayed. That is, the colors displayed will deviate from the original displaying colors if the display deviation appears in a monochrome of the mixing colors. The impedances of the fanouts are large and the delay of the signal is relatively serious under the image with mixing colors, which will easily cause the charging condition of the sub-pixel charged first to be less ideal than the charging condition of the sub-pixel charged subsequently. Especially on the both sides of the panel, where the impedance of the source fanout routing is largest, the difference of the charging conditions is particularly serious, thus leading to a phenomenon of colorcast.

BRIEF SUMMARY

Aiming at the drawbacks that it is easy for the colorcast to be appeared in the display panel during the color mixing process in the prior art, the objective of the present invention is to provide an anti-colorcast display panel to solve the problem above-mentioned.

The technical solutions of the present invention for solving the technical problems are as follows:

An anti-colorcast display panel is provided, comprising:

a plurality of scanning lines, the scanning lines are arranged in a row direction;

a plurality of data lines, the data lines are arranged in the direction perpendicular to the row direction and interlaced with the scanning lines;

sub-pixels arranged in a form of array, the sub-pixels constitute a plurality of pixel units, each of the pixel units includes m×n sub-pixels which are arranged in m rows and n columns; wherein m and n are natural numbers; each of the sub-pixels is disposed between two adjacent scanning lines and between two adjacent data lines;

each of the sub-pixels includes a transistor, the gate of the transistor is connected to the scanning line, the source of the transistor is connected to the data line, and the drain of the transistor is connected to two capacitors respectively;

in each of the pixel units, when the data line is connected to the source of the transistor within the pixel unit, the data line is connected to the sources of two adjacent sub-pixels in a single row respectively, and the gates of the two adjacent sub-pixels in a single row are connected to the two scanning lines on both sides of the sub-pixel in the single row.

In the anti-colorcast display panel of the present invention, every 4×4 sub-pixels form a pixel unit; in the pixel unit:

a first sub-pixel, the gate of the transistor is connected to a first scanning line, the source of the transistor is connected to a first data line;

a second sub-pixel, the gate of the transistor is connected to the first scanning line, the source of the transistor is connected to a third data line;

a third sub-pixel, the gate of the transistor is connected to a second scanning line, the source of the transistor is connected to the third data line;

a fourth sub-pixel, the gate of the transistor is connected to the second scanning line, the source of the transistor is connected to a fifth data line;

a fifth sub-pixel, the gate of the transistor is connected to a third scanning line, the source of the transistor is connected to a second data line;

a sixth sub-pixel, the gate of the transistor is connected to the second scanning line, the source of the transistor is connected to the second data line;

a seventh sub-pixel, the gate of the transistor is connected to the second scanning line, the source of the transistor is connected to a fourth data line;

an eighth sub-pixel, the gate of the transistor is connected to the third scanning line, the source of the transistor is connected to the fourth data line;

a ninth sub-pixel, the gate of the transistor is connected to a fourth scanning line, the source of the transistor is connected to the first data line;

a tenth sub-pixel, the gate of the transistor is connected to the fourth scanning line, the source of the transistor is connected to the third data line;

an eleventh sub-pixel, the gate of the transistor is connected to the third scanning line, the source of the transistor is connected to the third data line;

a twelfth sub-pixel, the gate of the transistor is connected to the third scanning line, the source of the transistor is connected to the fifth data line;

a thirteenth sub-pixel, the gate of the transistor is connected to the fourth scanning line, the source of the transistor is connected to the second data line;

a fourteenth sub-pixel, the gate of the transistor is connected to a fifth scanning line, the source of the transistor is connected to the second data line;

a fifteenth sub-pixel, the gate of the transistor is connected to the fifth scanning line, the source of the transistor is connected to the second data line;

a sixteenth sub-pixel, the gate of the transistor is connected to the fourth scanning line, the source of the transistor is connected to the fourth data line.

In the anti-colorcast display panel of the present invention, every 2×4 sub-pixels form a pixel unit; in the pixel unit:

a first sub-pixel, the gate of the transistor is connected to a first scanning line, the source of the transistor is connected to a first data line;

a second sub-pixel, the gate of the transistor is connected to the first scanning line, the source of the transistor is connected to a third data line;

a third sub-pixel, the gate of the transistor is connected to a second scanning line, the source of the transistor is connected to the third data line;

a fourth sub-pixel, the gate of the transistor is connected to the second scanning line, the source of the transistor is connected to a fifth data line;

a fifth sub-pixel, the gate of the transistor is connected to a third scanning line, the source of the transistor is connected to a second data line;

a sixth sub-pixel, the gate of the transistor is connected to the second scanning line, the source of the transistor is connected to the second data line;

a seventh sub-pixel, the gate of the transistor is connected to the second scanning line, the source of the transistor is connected to a fourth data line;

an eighth sub-pixel, the gate of the transistor is connected to the third scanning line, the source of the transistor is connected to the fourth data line.

In the anti-colorcast display panel of the present invention, every 4×2 sub-pixels form a pixel unit; in the pixel unit:

a first sub-pixel, the gate of the transistor is connected to a first scanning line, the source of the transistor is connected to a first data line;

a second sub-pixel, the gate of the transistor is connected to the first scanning line, the source of the transistor is connected to a third data line;

a third sub-pixel, the gate of the transistor is connected to the third scanning line, the source of the transistor is connected to a second data line;

a fourth sub-pixel, the gate of the transistor is connected to a second scanning line, the source of the transistor is connected to the second data line;

a fifth sub-pixel, the gate of the transistor is connected to a fourth scanning line, the source of the transistor is connected to the first data line;

a sixth sub-pixel, the gate of the transistor is connected to the fourth scanning line, the source of the transistor is connected to the third data line;

a seventh sub-pixel, the gate of the transistor is connected to the fourth scanning line, the source of the transistor is connected to the second data line;

an eighth sub-pixel, the gate of the transistor is connected to the fifth scanning line, the source of the transistor is connected to the second data line.

In the anti-colorcast display panel of the present invention, the sub-pixels in each row present a same color of red, green or blue, and every three consecutive rows of the sub-pixels present red, green, and blue in order.

An anti-colorcast display panel, comprising, a plurality of scanning lines, the scanning lines are arranged in a row direction;

a plurality of data lines, the data lines are arranged in the direction perpendicular to the row direction and interlaced with the scanning lines;

sub-pixels arranged in a form of array, the sub-pixels constitute a plurality of pixel units, each of the pixel units includes m×n sub-pixels which are arranged in m rows and n columns; wherein m and n are natural numbers; each of the sub-pixels is disposed between two adjacent scanning lines and between two adjacent data lines;

in each of the pixel units, when the data line is charging the sub-pixels in the pixel unit, the data line will charge two adjacent sub-pixels in a single row respectively, and the two adjacent sub-pixels in the single row are scanned by the two scanning lines on both sides of the sub-pixels in the single row.

In the anti-colorcast display panel of the present invention, the sub-pixels in each row present a same color of red, green or blue, and every three consecutive rows of the sub-pixels present red, green, and blue in order.

When implementing the anti-colorcast display panel of the present invention, the following advantageous effects can be achieved: when the color mixing is adopted, every kind of monochrome in each pixel unit is always carried out by means of charging two sub-pixels through the data line, and thus the radio of the sub-pixels with color cast to the whole color-mixing sub-pixels being decreased and the extent of the color cast being effectively suppressed. By implementing the display panel according to the present invention, the color-mixing effect on both sides of the panel is close to the color-mixing effect in the centre of the panel, and thus improving the color-displaying effect of the display panel, and in particular suitable for the narrow-frame monitor.

BRIEF DESCRIPTION OF THE DRAWINGS

The present invention will be further described with reference to the accompanying drawings and embodiments in the following, in the accompanying drawings.

DETAILED DESCRIPTION OF THE PREFERRED EMBODIMENT

The present invention will now be described in detail with reference to the accompanying drawings and embodiments.

In the present invention, m×n sub-pixels are considered as a pixel unit, and the connections of the transistors in the sub-pixels at the corresponding position of each pixel unit are same. When a data line Dn is connecting the source of a sub-pixel Pmn in one row of the pixel unit, it may connect the sources of two adjacent sub-pixels Pmn and Pmn−1 simultaneously. And then the gates of the two sub-pixels are respectively connected to two adjacent scanning lines Gm and Gm+1. In this way, when the data line is charging the sub-pixels, it can always charge the two adjacent sub-pixels at the same time. Even though the RC delay is disappeared on one sub-pixel, which leads to the color distortion, this ratio of the distorting sub-pixels to the whole color-mixing sub-pixels is low, so that the color cast can be effectively suppressed.

Figure 1:
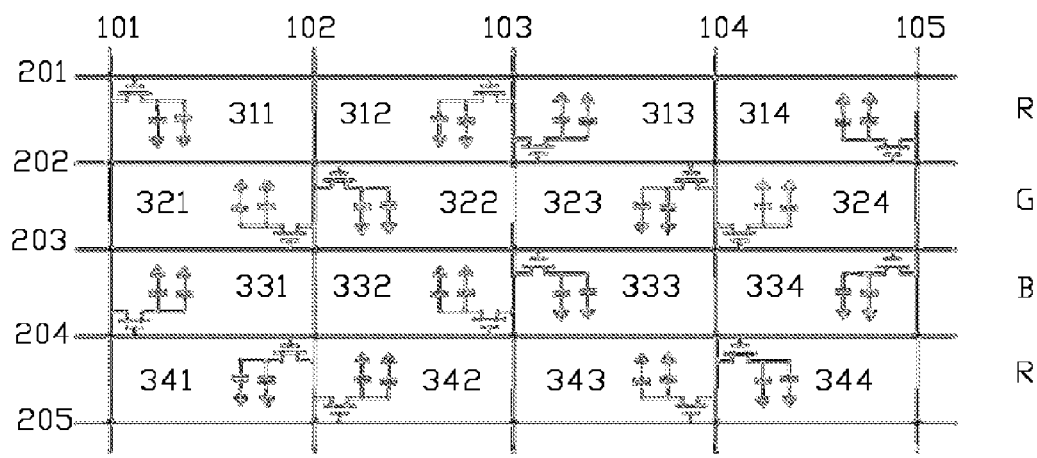
FIG. 1 is a schematic view shows the connections in a display panel according to a first embodiment of the present invention.

FIG. 1 is a schematic view shows the connections in a display panel according to a first embodiment of the present invention. In the present embodiment, the display panel includes a first scanning line 201, a second scanning line 202 . . . and an m scanning line arranged in the horizontal direction; and a first data line 101, a second data line 102 . . . and an n data line arranged in the vertical direction. Two adjacent scanning lines and two adjacent data lines are interlaced, and a sub-pixel is set in the centre. The sub-pixel includes a transistor, the gate of the transistor is connected to the scanning line, the source of the transistor is connected to the data line, and the drain of the transistor is connected to two capacitors, one is served as a liquid crystal capacitor and the other is served as a storage capacitor. One end of the liquid crystal capacitor is connected to the drain of the transistor, the other end of the liquid crystal capacitor is connected to a collective line, and the same for the storage capacitor. Each line of the sub-pixels is corresponding to one color, for example, in the embodiment, the first line is corresponding to red (R), the second line is corresponding to green (G), the third line is corresponding to blue (B), and others are repeated according to this rule.

Every 4×4 sub-pixels form a pixel unit. The connections of the gates and drains of the transistors in the sub-pixels at the corresponding position in each pixel unit are same. In the embodiment, it is specifically described as follows:

TABLE 1

| Sub-pixel | Gate | Source |
|---|---|---|
| First sub-pixel 311 | First scanning line 201 | First data line 101 |
| Second sub-pixel 312 | First scanning line 201 | Third data line 103 |
| Third sub-pixel 313 | Second scanning line 202 | Third data line 103 |
| Fourth sub-pixel 314 | Second scanning line 202 | Fifth data line 105 |
| Fifth sub-pixel 321 | Third scanning line 203 | Second data line 102 |
| Sixth sub-pixel 322 | Second scanning line 202 | Second data line 102 |
| Seventh sub-pixel 323 | Second scanning line 202 | Fourth data line 104 |
| Eighth sub-pixel 324 | Third scanning line 203 | Fourth data line 104 |
| Ninth sub-pixel 331 | Fourth scanning line 204 | First data line 101 |
| Tenth sub-pixel 332 | Fourth scanning line 204 | Third data line 103 |
| Eleventh sub-pixel 333 | Third scanning line 203 | Third data line 103 |
| Twelfth sub-pixel 334 | Third scanning line 203 | Fifth data line 105 |
| Thirteenth sub-pixel 341 | Fourth scanning line 204 | Second data line 102 |
| Fourteenth sub-pixel 342 | Fifth scanning line 205 | Second data line 102 |
| Fifteenth sub-pixel 343 | Fifth scanning line 205 | Fourth data line 104 |
| Sixteenth sub-pixel 344 | Fourth scanning line 204 | Fourth data line 104 |

When color mixing is adopted in the pixel unit, each data line can always charge the transistors in two sub-pixels with the same color simultaneously. For example, if purple which is mixed from red and blue is demanded to be displayed now, the third data line may be charged, so that the second sub-pixel 312, the third sub-pixel 313, the tenth sub-pixel 332 and the eleventh sub-pixel 333 can be charged by the third data line; while the scanning lines are scanning from top to bottom. Therefore, the displaying order is as follows: the second sub-pixel 312→the third sub-pixel 313→the eleventh sub-pixel 333→the tenth sub-pixel 332.

Figure 2:
FIG. 2 shows color-mixing signals from the center of the display panel according to the first embodiment of the present invention.
Figure 3:
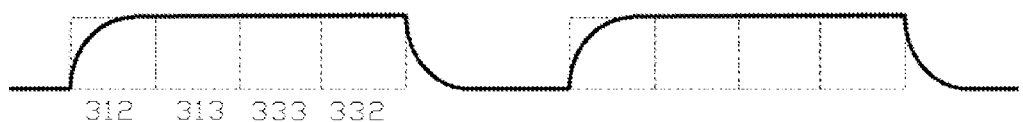
FIG. 3 shows color mixing signals from the edges of the display panel according to the first embodiment of the present invention.

The delay of the signal is different at different positions of the panel. When the pixel unit in FIG. 1 is in the centre of the panel, the amount of the delay is small, and during the following scanning process, the second sub-pixel 312→the third sub-pixel 313→the eleventh sub-pixel 333→the tenth sub-pixel 332, there is almost no distortion in all the sub-pixels, as shown in FIG. 2. However, when the pixel unit in FIG. 1 is at the edge of the display panel, the scanning signal will be shown in FIG. 3 due to the delay. Although a distorting portion will be appeared when scanning the second sub-pixel 312, the ratio of the distorting portion to the whole displaying part is minimal as the display of purple is carried out by two red sub-pixels and two blue sub-pixels. Thus, the phenomenon of bluish purple due to the distortion can be effectively suppressed. The above is the case in which the mixing color is purple, when other colors are displayed, only some adaptive modifications can be made to the corresponding scanning lines and data lines.

Figure 4:
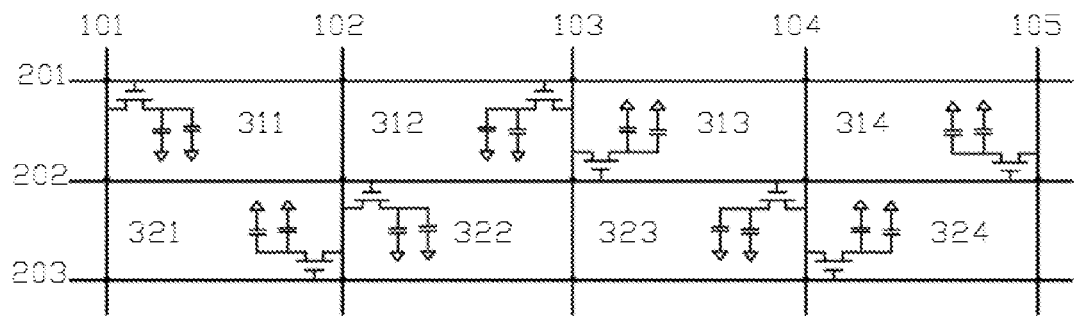
FIG. 4 is a schematic view shows the connections in a display panel according to a second embodiment of the present invention; and, FIG. 5 is a schematic view shows the connections in a display panel according to a third embodiment of the present invention.

FIG. 4 shows a second embodiment of the present invention. In the embodiment, the scanning lines, the data lines and the color setting of each line of sub-pixels are the same with those in the first embodiment. The difference lies in that, in the second embodiment, the pixel unit includes 2×4 sub-pixels. In each pixel unit, the connection of the transistor in each sub-pixel is shown as follows:

TABLE 2

| Sub-pixel | Gate | Source |
|---|---|---|
| First sub-pixel 311 | First scanning line 201 | First data line 101 |
| Second sub-pixel 312 | First scanning line 201 | Third data line 103 |
| Third sub-pixel 313 | Second scanning line 202 | Third data line 103 |
| Fourth sub-pixel 314 | Second scanning line 202 | Fifth data line 105 |
| Fifth sub-pixel 321 | Third scanning line 203 | Second data line 102 |
| Sixth sub-pixel 322 | Second scanning line 202 | Second data line 102 |
| Seventh sub-pixel 323 | Second scanning line 202 | Fourth data line 104 |
| Eighth sub-pixel 324 | Third scanning line 203 | Fourth data line 104 |

When color mixing is implemented by the pixel unit in the present embodiment, the working mode is the same as that in the first embodiment. In the color-mixing process, each data line can always charge two adjacent sub-pixels in the same row simultaneously, which makes the phenomenon of colorcast at the edges of the display panel suppressed. Although in the second embodiment, it is not possible for each pixel unit to present a color of purple since a single pixel unit only includes two rows of sub-pixels, which is different from the first embodiment, the effect of purple displayed as a whole is completely the same with that in the first embodiment when considering that the whole display panel comprises a plurality of pixel units arranged in a repeating pattern.

Figure 5:
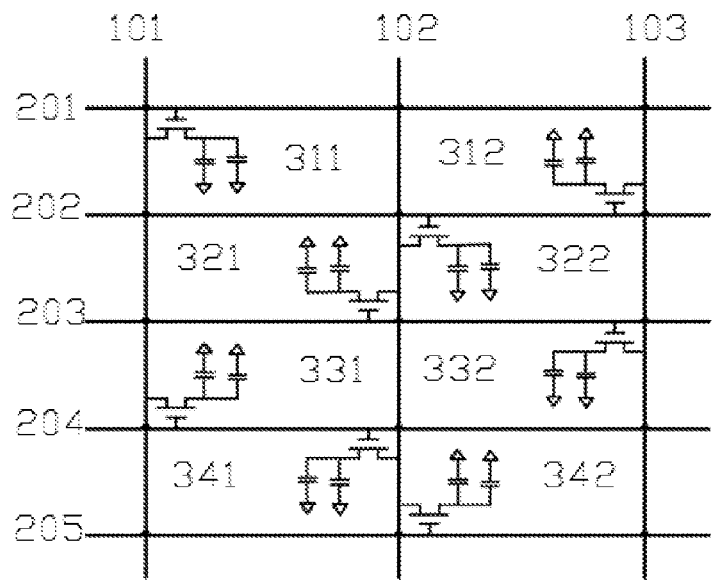

FIG. 5 shows a third embodiment of the present invention. In the embodiment, the scanning lines, the data lines and the color setting of the each row of sub-pixels are the same with those in two former embodiments. And in the third embodiment, the pixel unit is consisted of 4×2 pixels. In each pixel unit, the connection of the transistor is

TABLE 3

| Sub-pixel | Gate | Source |
|---|---|---|
| First sub-pixel 311 | First scanning line 201 | First data line 101 |
| Second sub-pixel 312 | First scanning line 201 | Third data line 103 |
| Third sub-pixel 321 | Third scanning line 203 | Second data line 102 |
| Fourth sub-pixel 322 | Second scanning line 202 | Second data line 102 |
| Fifth sub-pixel 331 | Fourth scanning line 204 | First data line 101 |
| Sixth sub-pixel 332 | Fourth scanning line 204 | Third data line 103 |
| Seventh sub-pixel 341 | Fourth scanning line 204 | Second data line 102 |
| Eighth sub-pixel 342 | Fifth scanning line 205 | Second data line 102 |

When color mixing is implemented by the pixel unit in the present embodiment, the working mode is the same as that in the first embodiment and the second embodiment. In the color-mixing process, each data line can always charge two adjacent sub-pixels in the same row simultaneously, which makes the colorcast at the edges of the display panel suppressed.

Several embodiments are given above, in which the display of the sub-pixels are controlled by the transistors in the sub-pixels. However, the present invention can be applied to other kinds of sub-pixels to suppress the color cast, as long as two adjacent sub-pixels in a signal row can be controlled to display by one data line when color mixing is implemented. A plurality of scanning lines are arranged in a row direction, and a plurality of data lines are arranged in the direction perpendicular to the row direction, and the data lines are interlaced with the scanning lines. The sub-pixels are distributed in a form of array, and the sub-pixels form a plurality of pixel units. Each of the pixel units includes m×n sub-pixels which are arranged in m rows and n columns, wherein m and n are natural numbers. Each of the sub-pixels is disposed between two adjacent scanning lines and two adjacent data lines. It is not limited to set a transistor in the sub-pixel, as long as in each pixel unit, when the data line is charging the sub-pixels in the pixel unit, the data line can charge the two adjacent sub-pixels in a single row respectively, and the two adjacent sub-pixels in a single row can be scanned by two scanning lines at both sides of the sub-pixels in the single row. That is, it should be ensured that the two adjacent sub-pixels are lightened at the same time in the color-mixing process.

Those mentioned above are detailed descriptions of the embodiments in the present invention, which cannot define the scope of the present invention. In the inspiration of the present invention, any equivalent or modification known by those ordinary skills in the art can be made to the present invention, which will also fall into the scope of the present invention.

The invention claimed is:

1. An anti-colorcast display panel, comprising,
a plurality of scanning lines, wherein the scanning lines are arranged in a row direction;
a plurality of data lines, wherein the data lines are arranged in the direction perpendicular to the row direction and interlaced with the scanning lines;
sub-pixels arranged in a form of array, wherein the sub-pixels constitute a plurality of pixel units, each of the pixel units includes m×n sub-pixels which are arranged in m rows and n columns; wherein m and n are natural numbers; each of the sub-pixels is disposed between two adjacent scanning lines and between two adjacent data lines;
wherein each of the sub-pixels includes a transistor, a gate of each transistor is connected to one of the scanning lines, a source of each transistor is connected to one of the data lines, and a drain of each transistor is connected to two capacitors respectively;
in each of the pixel units, each of the data lines is connected to the sources of two adjacent transistors in a single row respectively, and the gates of the two adjacent transistors in the single row are connected to two of the scanning lines on both sides of the sub-pixels in the single row; and
the sub-pixels in each row present a same color of red, green or blue, and every three consecutive rows of the sub-pixels present red, green, and blue in order.

2. The anti-colorcast display panel according to claim 1, wherein every 4×4 sub-pixels form a pixel unit; the pixel unit comprises:
a first sub-pixel, a gate of a first transistor of the first sub-pixel is connected to a first scanning line, a source of the first transistor is connected to a first data line;
a second sub-pixel, a gate of a second transistor of the second sub-pixel is connected to the first scanning line, a source of the second transistor is connected to a third data line;
a third sub-pixel, a gate of a third transistor of the third sub-pixel is connected to a second scanning line, a source of the third transistor is connected to the third data line;
a fourth sub-pixel, a gate of a fourth transistor of the fourth sub-pixel is connected to the second scanning line, a source of the fourth transistor is connected to a fifth data line;
a fifth sub-pixel, a gate of a fifth transistor of the fifth sub-pixel is connected to a third scanning line, a source of the fifth transistor is connected to a second data line;
a sixth sub-pixel, a gate of a sixth transistor of the sixth sub-pixel is connected to the second scanning line, a source of the sixth transistor is connected to the second data line;
a seventh sub-pixel, a gate of a seventh transistor of the seventh sub-pixel is connected to the second scanning line, a source of the seventh transistor is connected to a fourth data line;
an eighth sub-pixel, a gate of a eighth transistor of the eighth sub-pixel is connected to the third scanning line, a source of the eighth transistor is connected to the fourth data line;
a ninth sub-pixel, a gate of a ninth transistor of the ninth sub-pixel is connected to a fourth scanning line, a source of the ninth transistor is connected to the first data line;
a tenth sub-pixel, a gate of a tenth transistor of the tenth sub-pixel is connected to the fourth scanning line, a source of the tenth transistor is connected to the third data line;
an eleventh sub-pixel, a gate of a eleventh transistor of the eleventh sub-pixel is connected to the third scanning line, a source of the eleventh transistor is connected to the third data line;
a twelfth sub-pixel, a gate of a twelfth transistor of the twelfth sub-pixel is connected to the third scanning line, a source of the twelfth transistor is connected to the fifth data line;
a thirteenth sub-pixel, a gate of a thirteenth transistor of the thirteenth sub-pixel is connected to the fourth scanning line, a source of the thirteenth transistor is connected to the second data line;
a fourteenth sub-pixel, a gate of a fourteenth transistor of the fourteenth sub-pixel is connected to a fifth scanning line, a source of the fourteenth transistor is connected to the second data line;
a fifteenth sub-pixel, a gate of a fifteenth transistor of the fifteenth sub-pixel is connected to the fifth scanning line, a source of the fifteenth transistor is connected to the second data line; and
a sixteenth sub-pixel, a gate of a sixteenth transistor of the sixteenth sub-pixel is connected to the fourth scanning line, a source of the sixteenth transistor is connected to the fourth data line.

3. The anti-colorcast display panel according to claim 1, wherein every 2×4 sub-pixels form a pixel unit; the pixel unit comprises:
a first sub-pixel, a gate of a first transistor of the first sub-pixel is connected to a first scanning line, a source of the first transistor is connected to a first data line;
a second sub-pixel, a gate of a second transistor of the second sub-pixel is connected to the first scanning line, a source of the second transistor is connected to a third data line;
a third sub-pixel, a gate of a third transistor of the third sub-pixel is connected to a second scanning line, a source of the third transistor is connected to the third data line;
a fourth sub-pixel, a gate of a fourth transistor of the fourth sub-pixel is connected to the second scanning line, a source of the fourth transistor is connected to a fifth data line;
a fifth sub-pixel, a gate of a fifth transistor of the fifth sub-pixel is connected to a third scanning line, a source of the fifth transistor is connected to a second data line;
a sixth sub-pixel, a gate of a sixth transistor of the sixth sub-pixel is connected to the second scanning line, a source of the sixth transistor is connected to the second data line;

a seventh sub-pixel, a gate of a seventh transistor of the seventh sub-pixel is connected to the second scanning line, a source of the seventh transistor is connected to a fourth data line; and an eighth sub-pixel, a gate of a eighth transistor of the eighth sub-pixel is connected to the third scanning line, a source of the eighth transistor is connected to the fourth data line.

4. The anti-colorcast display panel according to claim 1, wherein every 4×2 sub-pixels form a pixel unit; the pixel unit comprises:

a first sub-pixel, a gate of a first transistor of the first sub-pixel is connected to a first scanning line, a source of the first transistor is connected to a first data line;

a second sub-pixel, a gate of a second transistor of the second sub-pixel is connected to the first scanning line, a source of the second transistor is connected to a third data line;

a third sub-pixel, a gate of a third transistor of the third sub-pixel is connected to the third scanning line, a source of the third transistor is connected to a second data line;

a fourth sub-pixel, a gate of a fourth transistor of the fourth sub-pixel is connected to a second scanning line, a source of the fourth transistor is connected to the second data line;

a fifth sub-pixel, a gate of a fifth transistor of the fifth sub-pixel is connected to a fourth scanning line, a source of the fifth transistor is connected to the first data line;

a sixth sub-pixel, a gate of a sixth transistor of the sixth sub-pixel is connected to the fourth scanning line, a source of the sixth transistor is connected to the third data line;

a seventh sub-pixel, a gate of a seventh transistor of the seventh sub-pixel is connected to the fourth scanning line, a source of the seventh transistor is connected to the second data line; and an eighth sub-pixel, a gate of a eighth transistor of the eighth sub-pixel is connected to the fifth scanning line, a source of the eighth transistor is connected to the second data line.

5. An anti-colorcast display panel, comprising, a plurality of scanning lines, wherein the scanning lines are arranged in a row direction;

a plurality of data lines, wherein the data lines are arranged in the direction perpendicular to the row direction and inter-laced with the scanning lines;

sub-pixels arranged in a form of array, wherein the sub-pixels constitute a plurality of pixel units, each of the pixel units includes m×n sub-pixels which are arranged in m rows and n columns; wherein m and n are natural numbers; each of the sub-pixels is disposed between two adjacent scanning lines and between two adjacent data lines;

wherein in each of the pixel units, when one of the data lines is charging the sub-pixels in the pixel unit, the data line will charge two adjacent sub-pixels in a single row respectively, and the two adjacent sub-pixels in the single row are scanned by two of the scanning lines on both sides of the sub-pixels in the single row; and the sub-pixels in each row present a same color of red, green or blue, and every three consecutive rows of the sub-pixels present red, green, and blue in order.

* * * * *